United States Patent
Liu

(10) Patent No.: US 9,172,384 B1
(45) Date of Patent: Oct. 27, 2015

(54) LOW-NOISE VOLTAGE REGULATOR FOR VOLTAGE-CONTROLLED OSCILLATOR

(71) Applicant: ALTERA CORPORATION, San Jose, CA (US)

(72) Inventor: Wing Liu, Milpitas, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/499,768

(22) Filed: Sep. 29, 2014

(51) Int. Cl.
  *H03L 7/00* (2006.01)
  *H03L 7/08* (2006.01)
  *H03L 5/00* (2006.01)
  *H03L 7/087* (2006.01)

(52) U.S. Cl.
  CPC .. *H03L 7/08* (2013.01); *H03L 5/00* (2013.01); *H03L 7/087* (2013.01)

(58) Field of Classification Search
  CPC ................................ H03L 7/189; H03L 7/087
  USPC .................. 331/10, 11, 12, 16, 34, 183, 74
  See application file for complete search history.

(56) References Cited

U.S. PATENT DOCUMENTS

| | | | |
|---|---|---|---|
| 5,880,579 A | 3/1999 | Wei et al. | |
| 8,120,429 B1 | 2/2012 | Hoang et al. | |
| 8,525,598 B2 * | 9/2013 | Saini | 331/34 |
| 2003/0155955 A1 | 8/2003 | Andrasic et al. | |

* cited by examiner

*Primary Examiner* — Arnold Kinkead
(74) *Attorney, Agent, or Firm* — Okamoto & Benedicto LLP

(57) ABSTRACT

One embodiment relates to an apparatus for regulating a voltage-controlled oscillator. The apparatus includes a digital-to-analog converter that has an input that receives a digital input signal and an output that outputs an analog control signal. A transistor receives the analog control signal so as to control an output voltage of the voltage-controlled oscillator. Control circuitry receives the output voltage and generates the digital input signal. Another embodiment relates to a method of regulating a voltage-controlled oscillator. A digital input signal is converted to an analog control signal using a digital-to-analog converter. The output voltage of the voltage-controlled oscillator is controlled using the analog control signal and monitored using a plurality of comparators. The digital input signal is changed depending on outputs of the plurality of comparators. Other embodiments, aspects, and features of the invention are also disclosed.

19 Claims, 9 Drawing Sheets

300

400

LOW-NOISE VOLTAGE REGULATOR FOR VOLTAGE-CONTROLLED OSCILLATOR

TECHNICAL FIELD

The present invention relates generally to integrated circuits. More particularly, the present invention relates to a voltage regulator circuit for a voltage-controlled oscillator.

DESCRIPTION OF THE BACKGROUND ART

Voltage-controlled oscillators (VCOs) are used in various applications, including in phase-locked loops (PLLs). A PLL may be formed, for example, by combining a VCO in a closed-loop with a phase detector, a charge pump, and a filter.

The frequency of the VCO output may be influenced by changes in power supply voltage. Such sensitivity of the VCO frequency to changes in power supply voltage may influence adversely the performance of the PLL. Hence, a voltage regulator may be used to regulate the power supply voltage to the VCO.

SUMMARY

One embodiment relates to an apparatus for regulating a voltage-controlled oscillator. The apparatus includes a digital-to-analog converter that has an input that receives a digital input signal and an output that outputs an analog control signal. A transistor receives the analog control signal so as to control an output voltage of the voltage-controlled oscillator. Control circuitry receives the output voltage and generates the digital input signal.

Another embodiment relates to a method of regulating a voltage-controlled oscillator. A digital input signal is converted to an analog control signal using a digital-to-analog converter. The output voltage of the voltage-controlled oscillator is controlled using the analog control signal and monitored using a plurality of comparators. The digital input signal is changed depending on outputs of the plurality of comparators.

Another embodiment relates to a control circuit for generating a digital control signal to regulate a voltage-controlled oscillator. The control circuit includes a plurality of comparators that receive an output voltage of the voltage-controlled oscillator and output comparison signals. The control circuit further includes calibration control logic that receives the comparison signals and generates the digital control signal.

Other embodiments, aspects, and features of the invention are also disclosed. Other embodiments, aspects, and features are also disclosed.

DETAILED DESCRIPTION

Figure 1A:
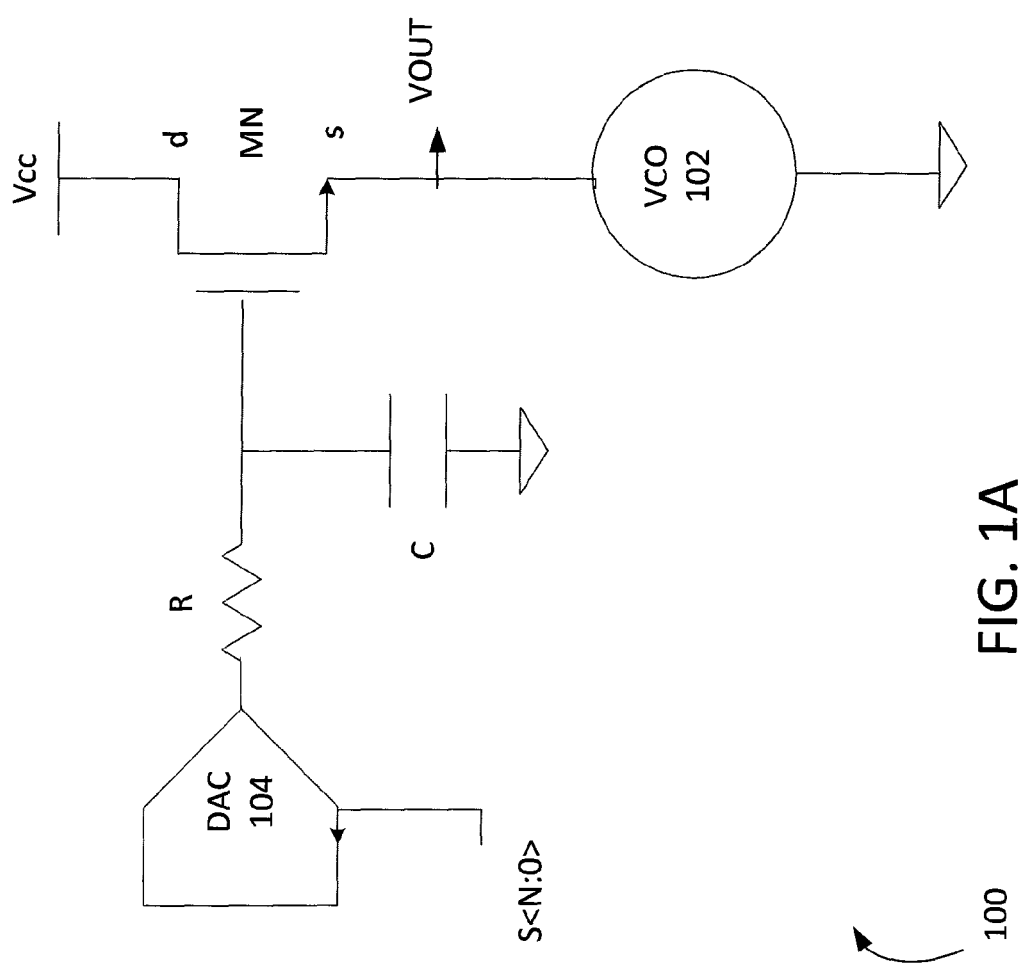
FIG. 1A depicts an exemplary regulated voltage-controlled oscillator (VCO) in accordance with an embodiment of the present invention.

FIG. 1A depicts an exemplary regulated voltage-controlled oscillator (VCO) in accordance with an embodiment of the present invention. As shown, the regulated VCO 100 utilizes a digital-to-analog converter (DAC) 104 to regulate the voltage output (VOUT) by the VCO 102.

Unlike a conventional regulator for a VCO, there is no operational amplifier (OpAmp) in the VCO regulator circuit shown in FIG. 1. Instead, the DAC 104 and a digital calibration method 400 (see FIG. 4) is used to calibrate the regulator output voltage to the desired value.

As shown, the DAC 104 is controlled by the DAC input, shows as the (N+1)-bit signal SEL<N:0>. SEL <N:0> may indicate one of $2^{N+1}$ digital inputs and the DAC 104 converts the digital input to a corresponding analog voltage levels. The DAC input, SEL <N:0>, may be decremented, incremented, or kept the same so as to control the voltage output by the DAC 104. The determination as to whether the DAC input is to be decremented, incremented, or kept the same may be made using the digital calibration method 400 described in relation to FIG. 4.

A low-pass filter including a resistor (R) and a capacitor (C) may be used to filter the output of the DAC 104. Advantageously, the low-pass filter filters out the higher-frequency device noise from the DAC 104 and also rejects the higher-frequency power supply noise. The bandwidth (i.e. the pass band) of the low-pass filter may be set to be much lower than the bandwidth of the receiver clock-data-recovery (CDR) circuit so that the low-frequency noise may be tracked by the CDR.

As shown, an NMOS transistor, MN, has its drain (d) connected to a power supply node (Vcc) and its source (s) connected to the output node (VOUT) of the VCO 102. The VCO 102 may be arranged between VOUT and a common ground. The output voltage of the low-pass filter may be applied to the gate of the NMOS transistor MN.

Figure 1B:
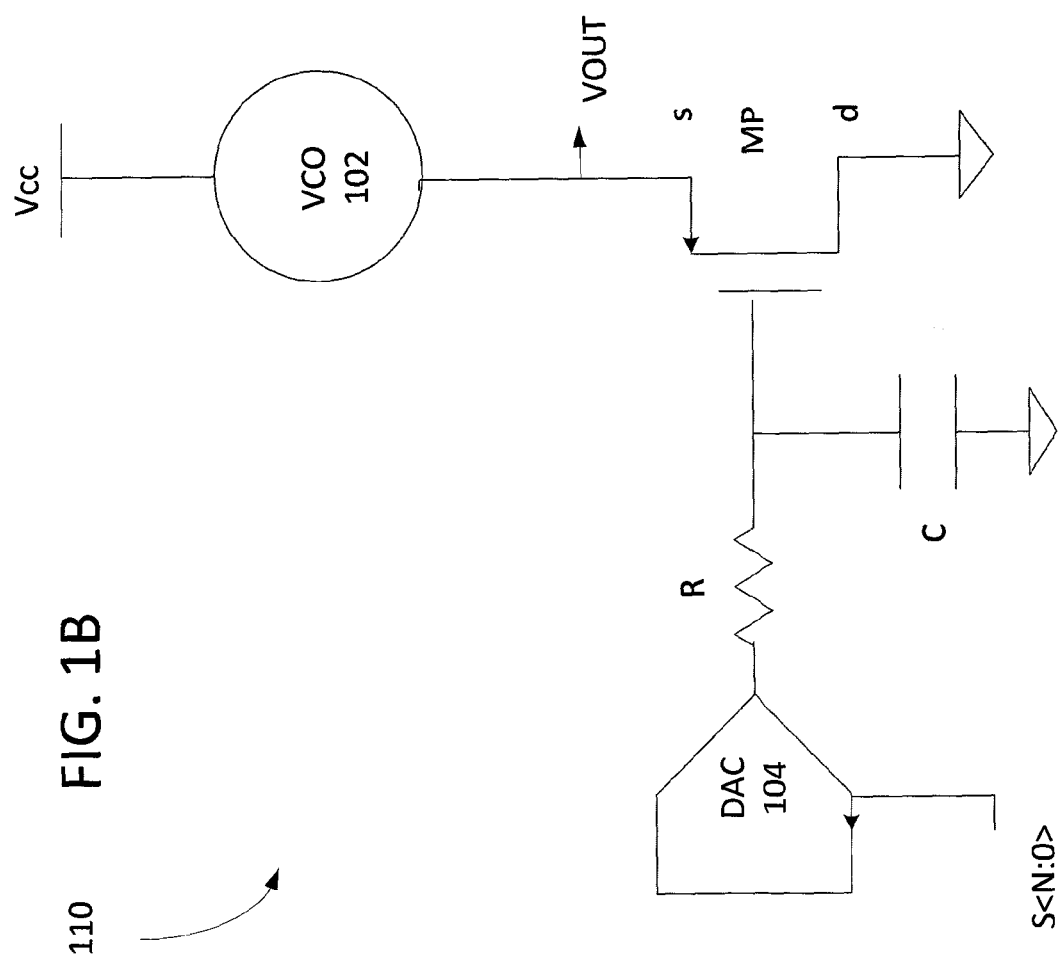
FIG. 1B depicts a regulated VCO in accordance with another embodiment of the present invention.

FIG. 1B depicts a regulated VCO in accordance with another embodiment of the present invention. In this embodiment, a PMOS transistor, MP, has its drain (d) connected to a common ground and its source (s) connected to the output node (VOUT) of the VCO 102. The VCO 102 may be arranged between VOUT and a power supply voltage (Vcc). The output voltage of the low-pass filter may be applied to the gate of the PMOS transistor MP.

Figure 2:
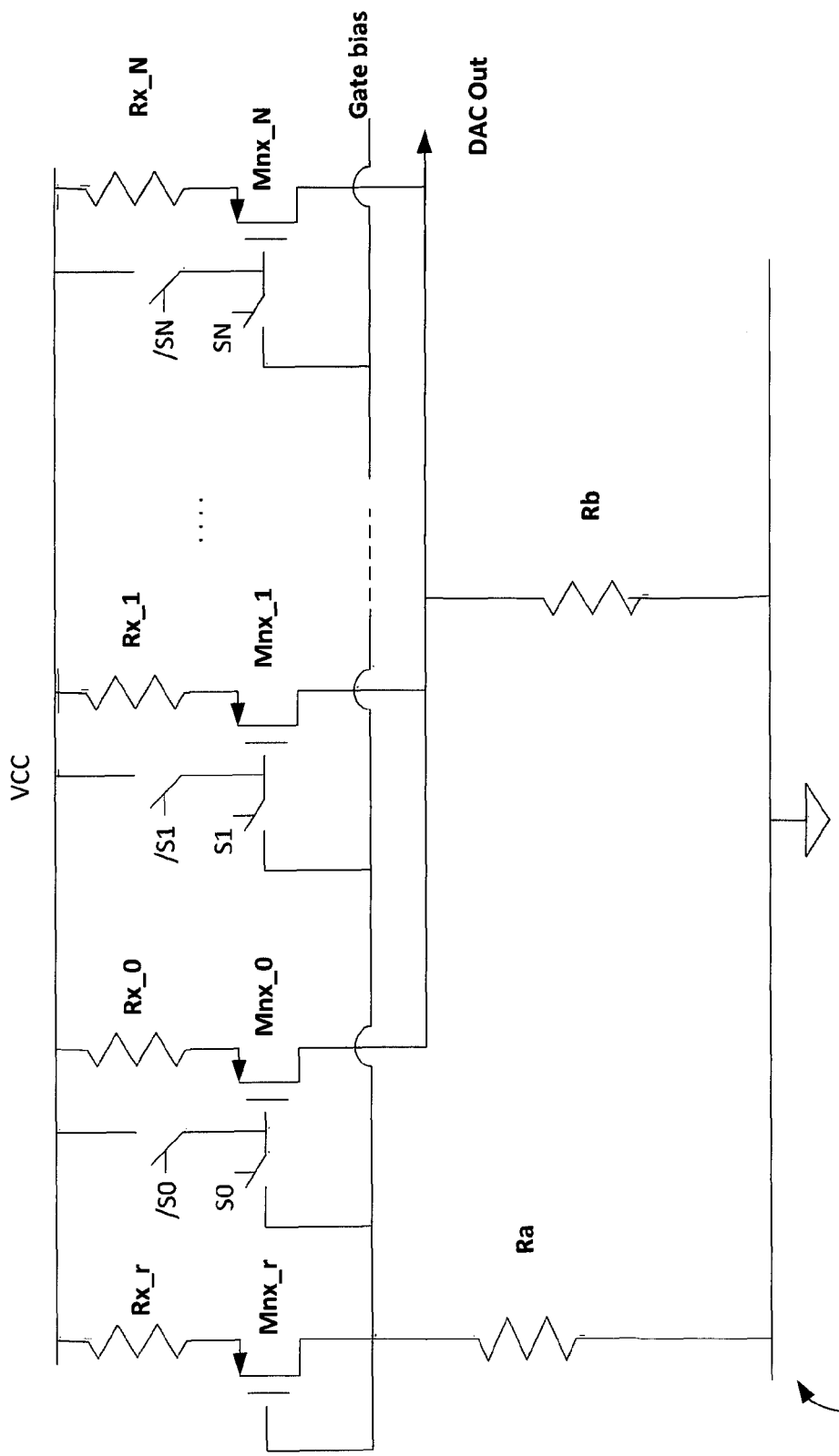
FIG. 2 depicts an exemplary circuit for a digital-to-analog converter in accordance with an embodiment of the invention.

FIG. 2 depicts an exemplary circuit for the DAC 104 in accordance with an embodiment of the invention. Note that, while a specific implementation of the DAC 104 is depicted in FIG. 2, other DAC circuit structures may be used for the DAC 104 in accordance with other embodiments of the present invention.

As shown, the DAC 104 may include two resistors (Ra and Rb), a reference transistor (Mnx_r) in series with a reference resistor (Rx_r), N−1 pull-up transistors (Mnx_0, Mnx_1, …

Mnx_N) in series with N+1 resistors (Rx_0, Rx_1, ..., Rx_N), and N+1 pairs of switches (S0 and /S0, S1 and /S1, ..., SN and /SN) for controlling the N+1 pull-up transistors. The inputs (S0, S1, SN) to the switches may correspond to the DAC inputs (SEL<0>, SEL<1>, ..., SEL<N>), and the pull-up transistors and associated resistors may be sized in a binary-weighted manner relative to each other so that the analog output (DAC Out) of the DAC circuit 104 is the desired output given the digital input SEL<N:0>.

Note that, based on the DAC circuit 104 shown in FIG. 2, the minimum power supply voltage may be determined to be I*Rx+Vdsat(Mnx)+Vgs+Vout. Transistors Mnx in the DAC may be pushed to the linear region as long as the DAC is still monotonic. Therefore, Vdsat of Mnx may be smaller compared to the Vdsat of an OpAmp output stage of a conventional VCO regulator. The I*Rx term may also be made smaller than Vdsat by selecting a smaller I or R.

Figure 3:
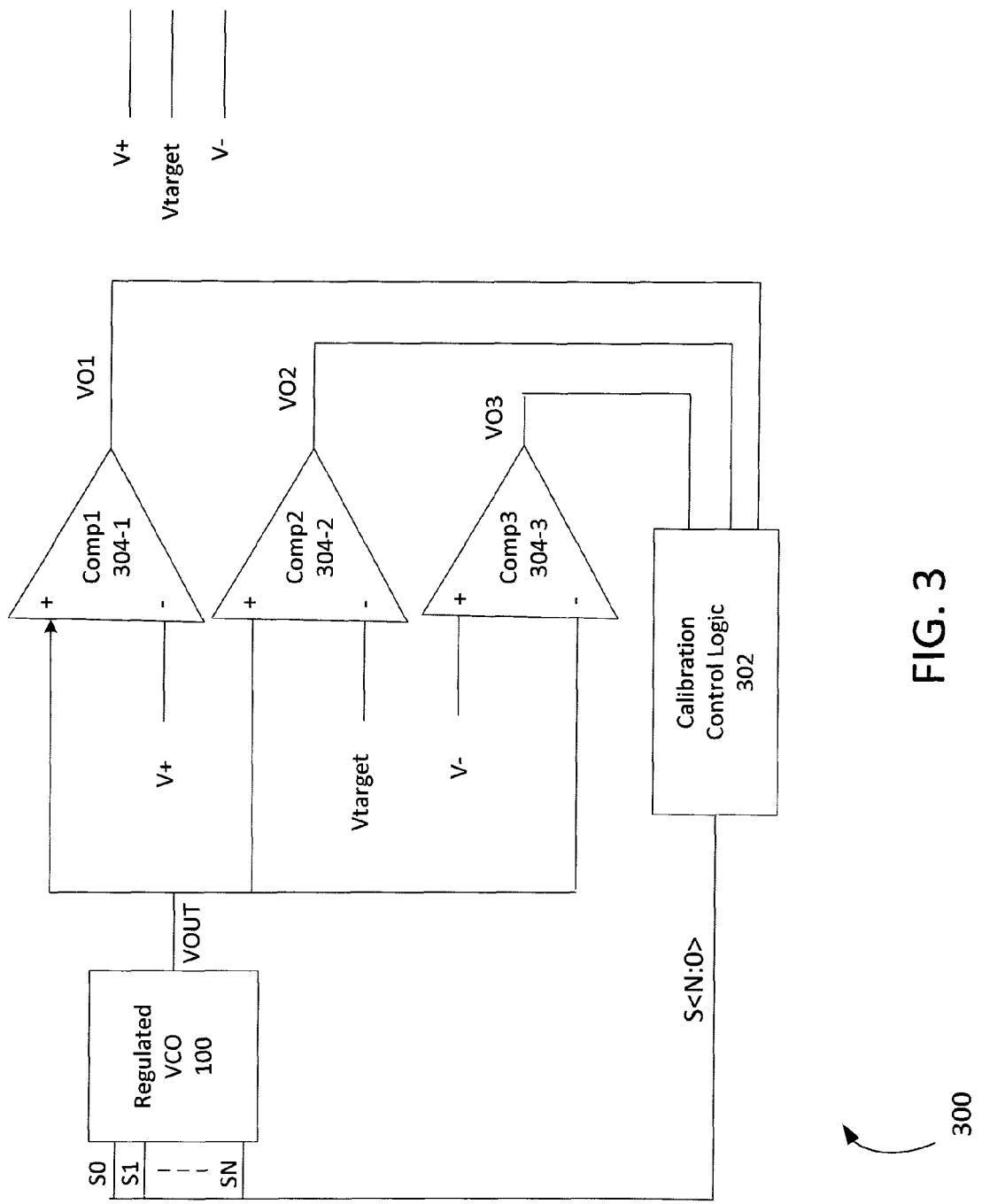
FIG. 3 depicts an exemplary control circuit for controlling the VCO regulator of FIG. 1 in accordance with an embodiment of the present invention.

FIG. 3 depicts an exemplary control circuit 300 for controlling the regulated VCO 100 of FIG. 1 in accordance with an embodiment of the present invention. As shown, the control circuit 300 may be implemented using calibration control logic 302 and a plurality of comparators (Comp1 304-1, Comp2 304-2, and Comp3 304-3).

Each comparator has two inputs: one input receiving the output (VOUT) of the regulated VCO 100; and another input receiving a fixed voltage level. The fixed voltage level may be configurable by electronic programming.

In the implementation shown, the first comparator (Comp1 304-1) receives VOUT at its positive input terminal, receives a high threshold voltage (V+) at its negative input terminal, and outputs VO1. The second comparator (Comp2 304-2) receives VOUT at its positive input terminal, receives a target voltage (Vtarget) at its negative input terminal, and outputs VO2. Finally, the third comparator (Comp3 304-3) receives VOUT at its negative input terminal, receives a low threshold voltage (V−) at its positive input terminal, and outputs VO3. As depicted in FIG. 3, the high threshold voltage (V+) is higher than Vtarget, and the low threshold voltage (V−) is lower than Vtarget.

In a first case, when VOUT is higher than V+, then VO1 and VO2 are high, while VO3 is low. In a second case, when VOUT is between V+ and Vtarget, then VO2 is high, while VO1 and VO3 are low. In a third case, when VOUT is between Vtarget and V−, then VO1, VO2 and VO3 are all low. Lastly, in a fourth case, when VOUT is lower than V−, then VO3 is high, while VO1 and VO2 are low.

Calibration logic 302 receives VO1, VO2 and VO3 and uses those inputs to determine the digital control signal S<N:0> to send to the regulated VCO 100. In one embodiment of the invention, the calibration logic 302 may implement the method 400 described below in relation to FIG. 4.

Figure 4:
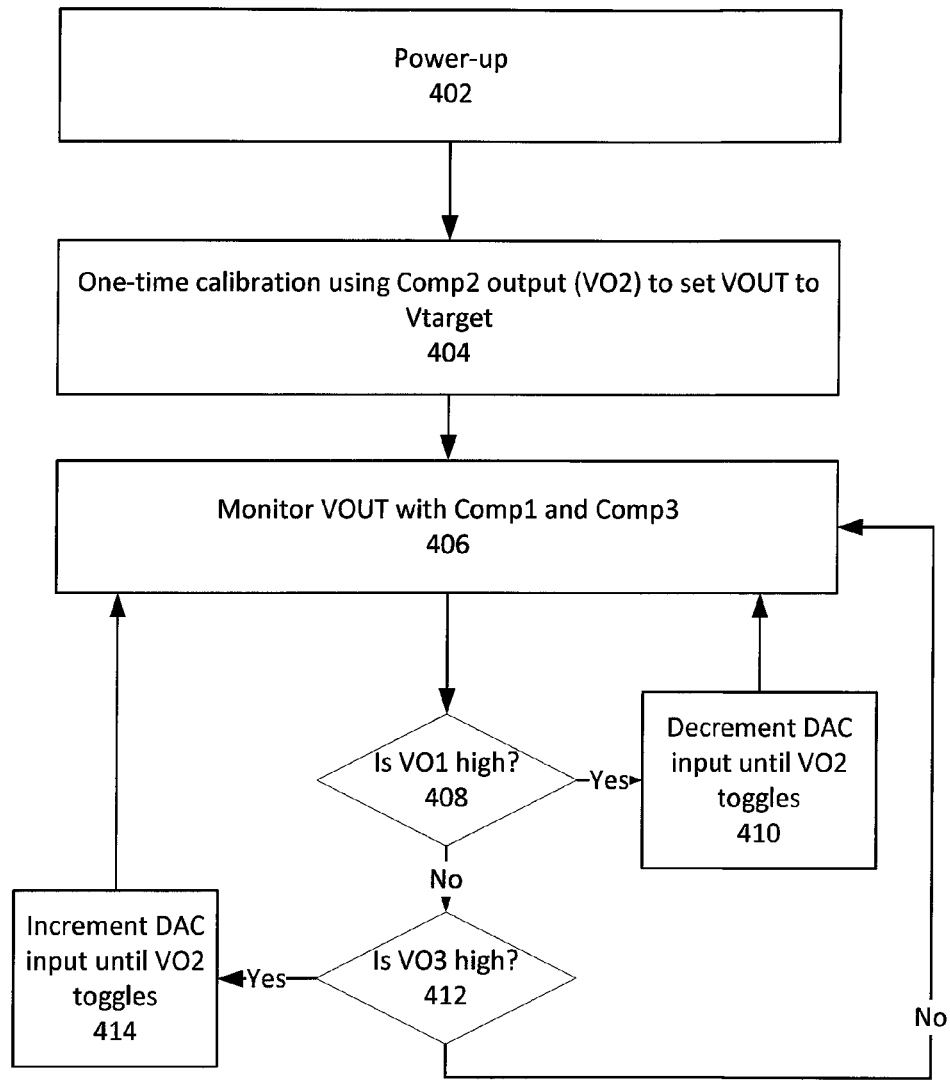
FIG. 4 is a flow chart of an exemplary method for low-noise voltage regulation for a VCO in accordance with an embodiment of the present invention.

FIG. 4 is a flow chart of an exemplary method 400 for low-noise voltage regulation for a VCO in accordance with an embodiment of the present invention. The method 400 may be performed, for example, using the circuitry described above.

As shown, after the circuitry is powered up per block 402, a one-time (i.e. an initial) calibration may be performed per block 404. The one-time calibration sets the output of the VCO to a target voltage. Using the exemplary circuitry 300 of FIG. 3, the Comp2 output (VO2) may be used to set VOUT to Vtarget.

For example, if VO2 is initially high, then the calibration control logic 302 may determine that VOUT is above Vtarget. Hence, the DAC input may be decremented until VO2 goes low. At that point, VOUT is approximately Vtarget, so the one-time calibration may be determined to be complete. On the other hand, if VO2 is initially low, then the calibration control logic 302 may determine that VOUT is below Vtarget. Hence, the DAC input may be incremented until VO2 goes low. At that point, VOUT is approximately Vtarget, so the one-time calibration may be determined to be complete.

After the one-time calibration is complete, then the calibration control logic 302 may monitor VOUT per block 406. Using the exemplary circuitry 300 of FIG. 3, the monitoring of VOUT may be accomplished by monitoring the Comp1 and Comp3 binary signals.

For example, when VO1 is high per block 408, then VOUT has gone above V+, so the calibration control logic 302 may decrement the DAC input (by decrementing the binary number represented by S<N:0>) per block 410. The decrementing per block 410 may continue until VO2 toggles from high to low. At that point, VOUT is approximately Vtarget such that the decrementing per block 410 may be deemed to be complete. Hence, once VOUT moves above V+, then the calibration control logic 302 may lower VOUT back to Vtarget.

On the other hand, when VO3 is high per block 412, then VOUT has gone below V−, so the calibration control logic 302 may increment the DAC input (by incrementing the binary number represented by S<N:0>) per block 414. The incrementing per block 414 may continue until VO2 toggles from low to high. At that point, VOUT is approximately Vtarget such that the incrementing per block 414 may be deemed to be complete. Hence, once VOUT moves below V−, then the calibration control logic 302 may raise VOUT back to Vtarget.

Any DAC output changes from this re-calibration of VOUT will pass through the low-pass filter. The effect on the VCO is similar to a low-frequency jitter in VOUT that may be effectively tracked by the CDR of the receiver.

Figure 5:
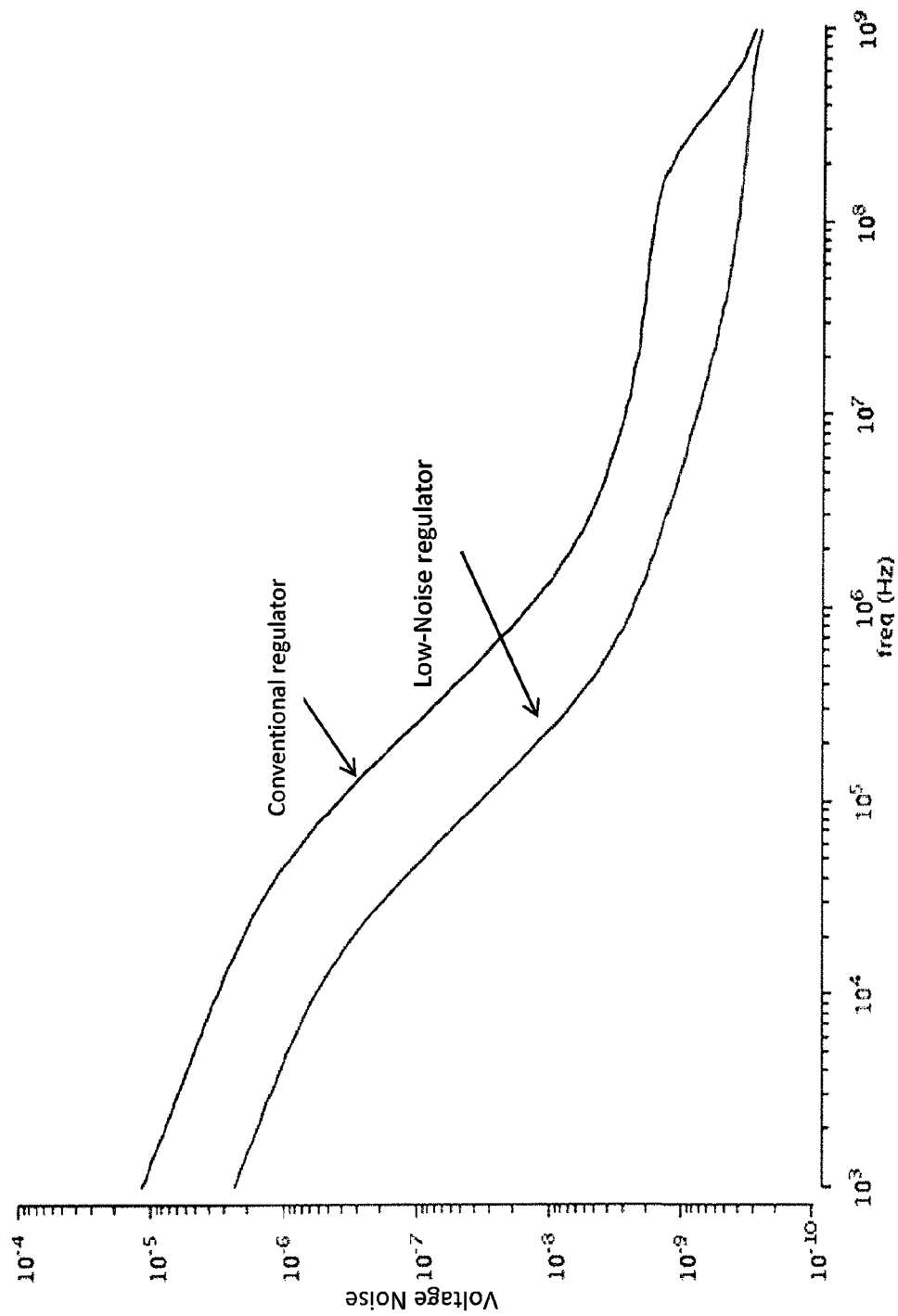
FIG. 5 is a graph showing reduced regulator output noise for a low-noise regulator in accordance with an embodiment of the present invention.

FIG. 5 is a graph showing reduced regulator output noise for a low-noise regulator in accordance with an embodiment of the present invention. The graph is generated by circuit simulation.

The graph in FIG. 5 shows that the low-noise regulator described above has lower output noise than a conventional regulator which utilizes an operational amplifier. As seen in the graph, the noise is reduced by factor of almost ten in the frequency range below a few hundred megahertz.

Figure 6:
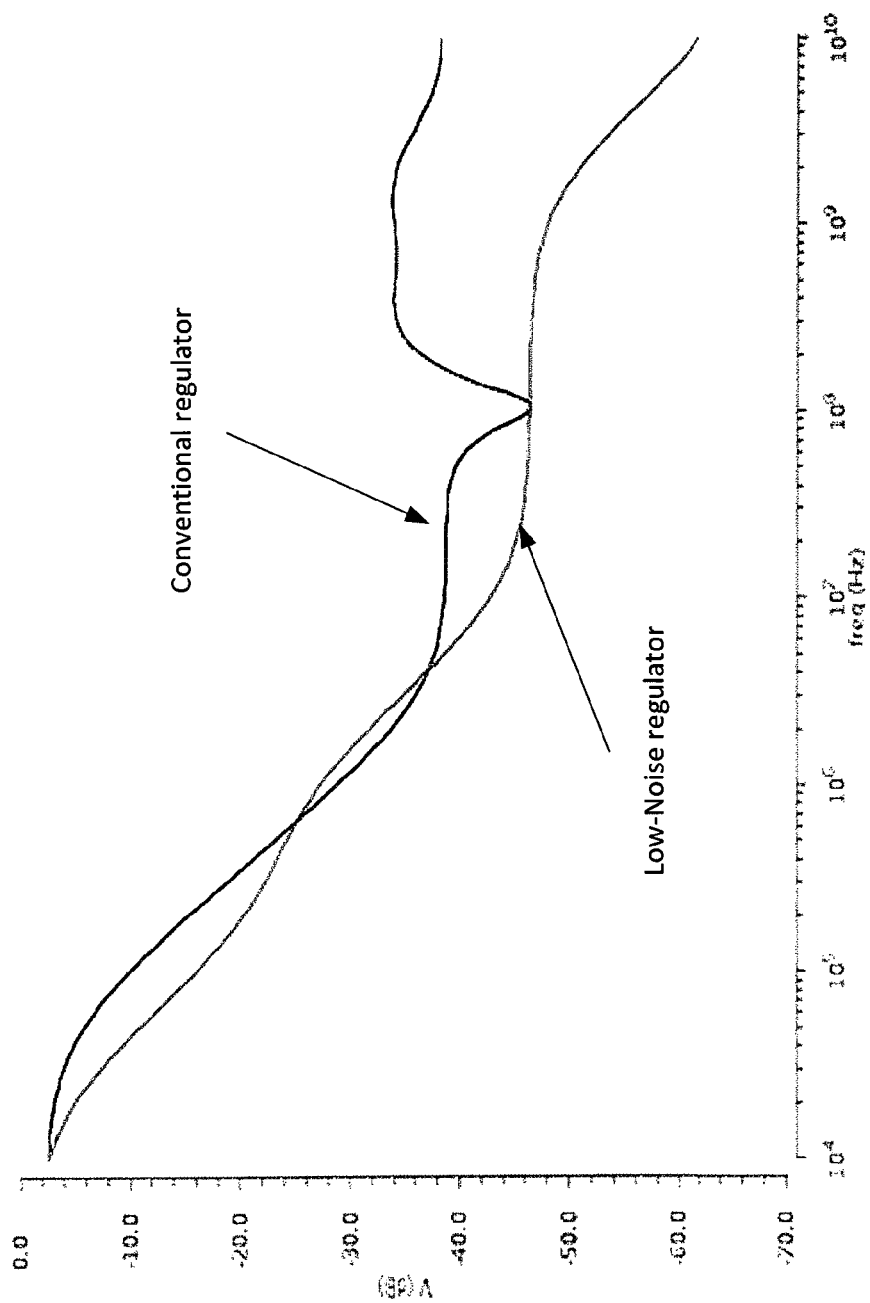
FIG. 6 is a graph showing improved regulator power supply noise rejection for a low-noise regulator in accordance with an embodiment of the present invention.

FIG. 6 is a graph showing improved regulator power supply noise rejection for a low-noise regulator in accordance with an embodiment of the present invention. The graph is generated by circuit simulation.

The graph in FIG. 6 shows that the low-noise regulator described above has power supply noise rejection that is superior compared with a conventional regulator which utilizes an operational amplifier. As seen in the graph, the low-noise regulator has particularly better power supply noise rejection in the frequency range higher than 100 MHz.

Figure 7:
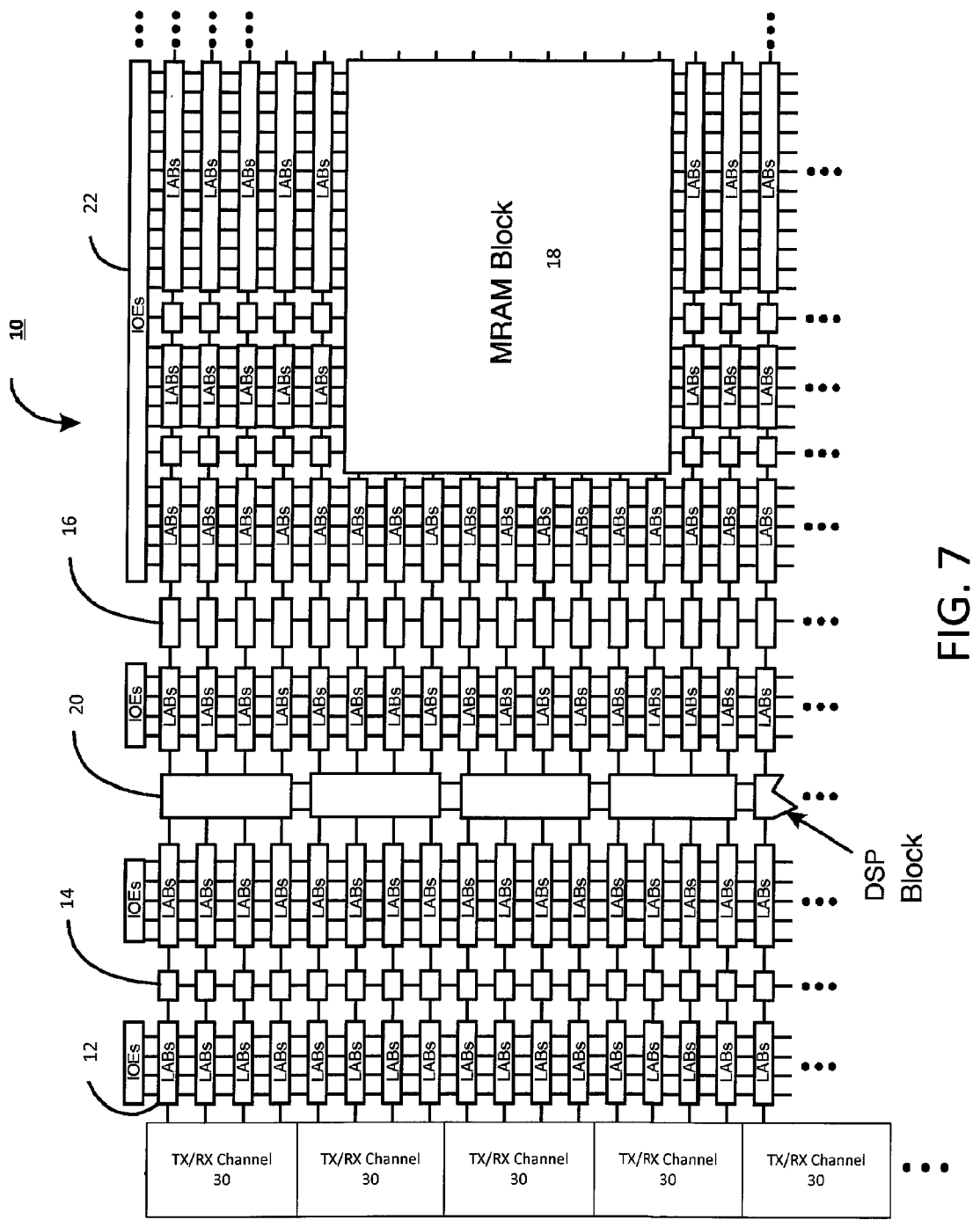
FIG. 7 is a simplified partial block diagram of a field programmable gate array (FPGA) that may be configured to implement an embodiment of the present invention.

FIG. 7 is a simplified partial block diagram of a field programmable gate array (FPGA) 10 that may be configured with circuitry to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

An array of physical coding sublayer (PCS) and physical medium attachment (PMA) circuitry 30 may be included as shown, for example. The PCS circuitry generally provides digital logic functions which implement data communication protocols, while the PMA circuitry generally provides mixed (analog/digital) signal functionality for the data communications. For example, for certain protocols, the PCS circuitry may be configured to perform, among other functions, 8 bit-to-10 bit and/or 128 bit-to-130 bit encoding for data to be sent to the PMA circuitry and 10 bit-to-8 bit and/or 130 bit-to-128 bit decoding for data received from the PMA circuitry. The PMA circuitry may be configured to perform, among other functions, serialization of data to be transmitted (conversion from parallel to serial) and de-serialization of received data (conversion from serial to parallel).

In accordance with an embodiment of the invention, the PMA/PCS array 30 may implement the circuits and methods described above. In particular, one or more phase-locked loop (PLL) circuits 32 in the PMA/PCS array 30 may regulate the voltage for a VCO using the above-described circuits and methods.

It is to be understood that FPGA 10 is described herein for illustrative purposes only and that the present invention can be implemented in many different types of PLDs, FPGAs, and ASICs.

Figure 8:
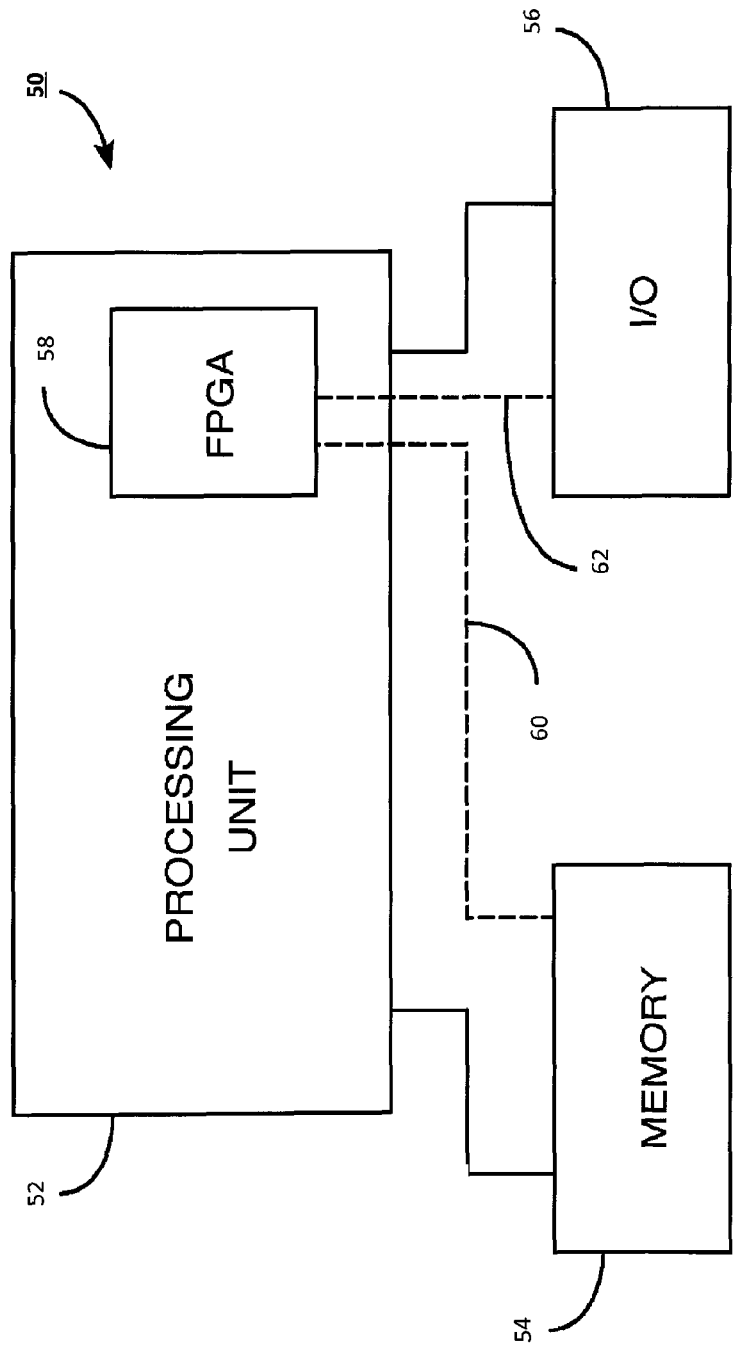
FIG. 8 shows a block diagram of an exemplary digital system that may be configured to utilize an embodiment of the present invention.

FIG. 8 shows a block diagram of an exemplary digital system 50 that can embody techniques of the present invention. As shown, the exemplary digital system 50 may include an FPGA as one of several components.

System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 may be programmed to implement the logical functions necessary to carry on its particular role in system operation. FPGA 58 may be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An apparatus for regulating a voltage-controlled oscillator, the apparatus comprising:
   a digital-to-analog converter that has an input that receives a digital input signal and an output that outputs an analog control signal;
   a transistor having an input that receives the analog control signal so as to control an output voltage of the voltage-controlled oscillator; and
   control circuitry that receives the output voltage and generates the digital input signal, wherein the control circuitry comprises a plurality of comparators and calibration control logic.

2. The apparatus of claim 1 further comprising:
   a low-pass filter between the output of the digital-to-analog converter and the input of the transistor.

3. The apparatus of claim 2, wherein the transistor has a first end of a channel connected to a voltage supply, a second end of the channel connected to an output node of the voltage-controlled oscillator, and a gate connected to an output of the low-pass filter.

4. An apparatus for regulating a voltage-controlled oscillator, the apparatus comprising:
   a digital-to-analog converter that has an input that receives a digital input signal and an output that outputs an analog control signal;
   a transistor having an input that receives the analog control signal so as to control an output voltage of the voltage-controlled oscillator;

a low-pass filter between the output of the digital-to-analog converter and the input of the transistor; and control circuitry that receives the output voltage and generates the digital input signal, wherein the transistor has a first end of a channel connected to a common ground, a second end of the channel connected to an output node of the voltage-controlled oscillator, and a gate connected to an output of the low-pass filter.

5. The apparatus of claim 1, wherein the plurality of comparators comprises a target-level comparator that compares the output voltage of the voltage-controlled oscillator against a target voltage to generate a target-level comparison signal that is input to the calibration control logic.

6. The apparatus of claim 5, wherein the calibration control logic performs an initial calibration using the target-level comparison signal to bring the output voltage to the target voltage.

7. The apparatus of claim 5, wherein the plurality of comparators further comprises an upper-threshold comparator that compares the output voltage of the voltage-controlled oscillator against an upper-threshold voltage to generate an upper-threshold comparison signal that is input to the calibration control logic, and a lower-threshold comparator that compares the output voltage of the voltage-controlled oscillator against a lower-threshold voltage to generate an lower-threshold comparison signal that is input to the calibration control logic.

8. The apparatus of claim 7, wherein the calibration control logic uses the upper-threshold and lower-threshold comparison signals to monitor the output voltage.

9. The apparatus of claim 8, wherein the calibration control logic decrements the digital input signal when the upper-threshold comparison signal indicates that the output voltage is above the upper-threshold voltage.

10. The apparatus of claim 9, wherein the calibration control logic continues to decrement the digital input signal until the target-level comparison signal toggles.

11. The apparatus of claim 8, wherein the calibration control logic increments the digital input signal when the lower-threshold comparison signal indicates that the output voltage is below the lower-threshold voltage.

12. The apparatus of claim 11, wherein the calibration control logic continues to increment the digital input signal until the target-level comparison signal toggles.

13. A method of regulating a voltage-controlled oscillator, the method comprising:

converting a digital input signal to an analog control signal using a digital-to-analog converter;

controlling an output voltage of the voltage-controlled oscillator using the analog control signal;

monitoring the output voltage of the voltage-controlled oscillator using a plurality of comparators;

changing the digital input signal depending on outputs of the plurality of comparators, wherein the plurality of comparators comprises a target-level comparator that compares the output voltage of the voltage-controlled oscillator against a target voltage to generate a target-level comparison signal; and performing an initial calibration using the target-level comparison signal to bring the output voltage to the target voltage.

14. The method of claim 13 further comprising:

filtering the analog control signal with a low-pass filter prior to the analog control signal being used to control the output voltage of the voltage-controlled oscillator.

15. A method of regulating a voltage-controlled oscillator, the method comprising:

converting a digital input signal to an analog control signal using a digital-to-analog converter;

controlling an output voltage of the voltage-controlled oscillator using the analog control signal;

monitoring the output voltage of the voltage-controlled oscillator using a plurality of comparators;

changing the digital input signal depending on outputs of the plurality of comparators;

filtering the analog control signal with a low-pass filter prior to the analog control signal being used to control the output voltage of the voltage-controlled oscillator; and after the filtering, applying the analog control signal to a gate of a transistor to control the output voltage of the voltage-controlled oscillator, wherein an end of a channel of the transistor is connected to the output voltage of the voltage-controlled oscillator.

16. The method of claim 13, wherein the plurality of comparators further comprises an upper-threshold comparator that compares the output voltage of the voltage-controlled oscillator against an upper-threshold voltage to generate an upper-threshold comparison signal, and a lower-threshold comparator that compares the output voltage of the voltage-controlled oscillator against a lower-threshold voltage to generate an lower-threshold comparison signal, the method further comprising:

using the upper-threshold and lower-threshold comparison signals to monitor the output voltage.

17. The method of claim 16, further comprising:

decrementing the digital input signal when the upper-threshold comparison signal indicates that the output voltage is above the upper-threshold voltage; and incrementing the digital input signal when the lower-threshold comparison signal indicates that the output voltage is below the lower-threshold voltage.

18. The method of claim 17, wherein said decrementing continues until the target-level comparison signal toggles, and wherein said incrementing continues until the target-level comparison signal toggles.

19. A control circuit for generating a digital control signal to regulate a voltage-controlled oscillator, the control circuit comprising:

a plurality of comparators that receive an output voltage of the voltage-controlled oscillator and output comparison signals; and calibration control logic that receives the comparison signals and generates the digital control signal, wherein the plurality of comparators comprises:

a target-level comparator that compares the output voltage of the voltage-controlled oscillator against a target voltage to generate a target-level comparison signal;

an upper-threshold comparator that compares the output voltage of the voltage-controlled oscillator against an upper-threshold voltage to generate an upper-threshold comparison signal; and a lower-threshold comparator that compares the output voltage of the voltage-controlled oscillator against a lower-threshold voltage to generate an lower-threshold comparison signal.

* * * * *